US011193989B2

(12) United States Patent
Campiglio et al.

(10) Patent No.: US 11,193,989 B2
(45) Date of Patent: *Dec. 7, 2021

(54) MAGNETORESISTANCE ASSEMBLY HAVING A TMR ELEMENT DISPOSED OVER OR UNDER A GMR ELEMENT

(71) Applicants: Allegro MicroSystems, LLC, Manchester, NH (US); Commissariat à l'énergie atomique et aux énergies alternatives, Paris (FR)

(72) Inventors: Paolo Campiglio, Arcueil (FR); Bryan Cadugan, Bedford, NH (US); Amal Hamdache, Limours (FR); Florian Pallier, Orsay (FR); Claude Fermon, Orsay (FR)

(73) Assignees: Allegro MicroSystems, LLC, Manchester, NH (US); Commissariat à l'énergie atomique et aux énergies alternatives, Paris (FR)

( * ) Notice: Subject to any disclaimer, the term of this patent is extended or adjusted under 35 U.S.C. 154(b) by 40 days.

This patent is subject to a terminal disclaimer.

(21) Appl. No.: 16/047,342

(22) Filed: Jul. 27, 2018

(65) Prior Publication Data

US 2020/0033424 A1  Jan. 30, 2020

(51) Int. Cl.
*G01R 33/09* (2006.01)
*G01R 33/00* (2006.01)

(52) U.S. Cl.
CPC ....... *G01R 33/093* (2013.01); *G01R 33/0052* (2013.01); *G01R 33/098* (2013.01)

(58) Field of Classification Search
CPC ............... G01R 33/093; G01R 33/098; G01R 33/0052; G01R 33/09; G01R 33/0023; H01L 43/08; H01L 43/12; H01L 43/02
(Continued)

(56) References Cited

U.S. PATENT DOCUMENTS 6,473,275 B1   10/2002   Gill
6,549,382 B1   4/2003    Gill
(Continued)

FOREIGN PATENT DOCUMENTS

DE   102006010652 A1   9/2007
EP   2 880 665 A1       6/2015
EP   3 288 091 A1       2/2018

OTHER PUBLICATIONS

U.S. Non-Final Office Action dated Mar. 27, 2020 for U.S. Appl. No. 16/280,199; 14 Pages.
(Continued)

*Primary Examiner* — Douglas X Rodriguez
*Assistant Examiner* — Trung Q Nguyen
(74) *Attorney, Agent, or Firm* — Daly, Crowley, Mofford & Durkee, LLP

(57) ABSTRACT

A magnetoresistance assembly can include a substrate and a first GMR element disposed over the substrate, the first GMR element having a bottom surface and top surface. The magnetoresistance assembly can further include a first TMR element disposed over the substrate, the first TMR element having a top surface and a bottom surface, wherein a line perpendicular to and intersecting the top or bottom surface of the first TMR element intersects the first GMR element. The first GMR element and the first TMR element are in electrical communication.

38 Claims, 12 Drawing Sheets

(58) Field of Classification Search
USPC .............. 324/329–348, 323, 447, 425, 200, 324/202–206, 256–259, 600, 637, 639
See application file for complete search history.

(56) References Cited

U.S. PATENT DOCUMENTS

| | | |
|---|---|---|
| 6,937,497 B1 | 8/2005 | Ju et al. |
| 7,324,312 B2 | 1/2008 | Gill |
| 7,342,753 B2 | 3/2008 | Gill |
| 7,397,637 B2 | 7/2008 | Gill |
| 9,529,060 B2 | 12/2016 | Fermon et al. |
| 9,741,372 B1 | 8/2017 | Campiglio |
| 9,812,637 B2 | 11/2017 | Fermon et al. |
| 10,509,058 B2 | 12/2019 | Cadugan et al. |
| 10,620,279 B2 | 4/2020 | Campiglio et al. |
| 2002/0030489 A1 | 3/2002 | Lenssen et al. |
| 2002/0105827 A1 | 8/2002 | Redon et al. |
| 2003/0053270 A1 | 3/2003 | Gill |
| 2003/0235016 A1 | 12/2003 | Gill |
| 2004/0008454 A1 | 1/2004 | Gill |
| 2004/0012056 A1 | 1/2004 | Nejad et al. |
| 2004/0014243 A1 | 1/2004 | Drewes |
| 2004/0170055 A1 | 9/2004 | Albert et al. |
| 2007/0064350 A1 | 3/2007 | Gill |
| 2007/0230068 A1 | 10/2007 | Gill |
| 2007/0243118 A1 | 10/2007 | Rousseaux et al. |
| 2007/0253118 A1 | 11/2007 | Hayakawa et al. |
| 2009/0015252 A1 | 1/2009 | Raberg et al. |
| 2010/0128400 A1 | 5/2010 | Lin |
| 2010/0327857 A1 | 12/2010 | Hoshiya et al. |
| 2011/0062537 A1 | 3/2011 | Oh et al. |
| 2011/0163739 A1 | 7/2011 | Ono et al. |
| 2011/0169488 A1 | 7/2011 | Mather |
| 2012/0070695 A1 | 3/2012 | Kitagawa et al. |
| 2012/0112741 A1 | 5/2012 | Meguro et al. |
| 2012/0280336 A1 | 11/2012 | Jan et al. |
| 2015/0108972 A1 | 4/2015 | Zimmer et al. |
| 2015/0192648 A1 | 7/2015 | Campiglio et al. |
| 2015/0192649 A1 | 7/2015 | Dressler et al. |
| 2015/0194597 A1* | 7/2015 | Fermon ............... H01L 43/12 257/421 |
| 2016/0204341 A1 | 7/2016 | Gan et al. |
| 2016/0260772 A1 | 9/2016 | Usami et al. |
| 2016/0359103 A1 | 12/2016 | Fermon et al. |
| 2018/0074016 A1* | 3/2018 | Chen ............... G01N 27/745 |
| 2019/0051822 A1 | 2/2019 | Chatterjee et al. |
| 2019/0219643 A1 | 7/2019 | Cadugan et al. |
| 2020/0018780 A1 | 1/2020 | Cadugan et al. |
| 2020/0066580 A1 | 2/2020 | Peng et al. |
| 2020/0066967 A1 | 2/2020 | Suri et al. |

OTHER PUBLICATIONS

Response to U.S. Final Office Action dated Sep. 26, 2019 for U.S. Appl. No. 15/600,186; Response filed Oct. 22, 2019; 17 Pages.
Response to U.S. Final Office Action dated Sep. 26, 2019 for U.S. Appl. No. 15/991,491; Response filed Oct. 21, 2019; 15 Pages.
U.S. Advisory Action dated Nov. 1, 2019 for U.S. Appl. No. 15/991,491; 5 Pages.
Response to U.S. Final Office Action dated Sep. 26, 2019 and U.S. Advisory Action dated Nov. 1, 2019 for U.S. Appl. No. 15/991,491; Response filed Nov. 1, 2019; 15 Pages.
U.S. Non-Final Office Action dated Dec. 10, 2019 for U.S. Appl. No. 15/991,491; 13 Pages.
Response to U.S. Non-Final Office Action dated Dec. 5, 2019 for U.S. Appl. No. 15/600,186; Response filed on Dec. 10, 2019; 18 Pages.
PCT International Search Report and Written Opinion dated Nov. 30, 2018 for International Application No. PCT/US2018/028238; 11 Pages.
U.S. Final Office Action dated Apr. 7, 2020 for U.S. Appl. No. 15/991,491; 15 Pages.
U.S. Notice of Allowance dated Aug. 26, 2020 for U.S. Appl. No. 16/280,199; 15 Pages.
U.S. Appl. No. 16/157,313, filed Oct. 11, 2018, Lassalle-Balier et al.
U.S. Appl. No. 16/157,317, filed Oct. 11, 2018, Lassalle-Balier et al.
U.S. Appl. No. 16/507,552, filed Jul. 10, 2019, Lassalle-Balier et al.
U.S. Appl. No. 16/574,419, filed Sep. 18, 2019, Campiglio et al.
U.S. Appl. No. 16/684,932, filed Nov. 15, 2019, Campiglio et al.
U.S. Notice of Allowance dated Feb. 4, 2020 for U.S. Appl. No. 15/600,186; 10 Pages.
U.S. Non-Final Office Action dated Dec. 5, 2019 for U.S. Appl. No. 15/600,186; 18 Pages.
PCT International Preliminary Report dated Nov. 28, 2019 for International Application No. PCT/US2018/028238; 7 Pages.
U.S. Rule 312 Amendment filed on Feb. 18, 2020 for U.S. Appl. No. 15/600,186; 16 Pages.
Response to Rule 312 Communication dated Feb. 28, 2020 for U.S. Appl. No. 15/600,186; 2 Pages.
Response to U.S. Non-Final Office Action dated Dec. 10, 2019 for U.S. Appl. No. 15/991,491; Response filed Mar. 5, 2020; 17 Pages.
Response to U.S. Non-Final Office Action dated Jun. 13, 2019 for U.S. Appl. No. 15/600,186; Response filed Aug. 29, 2019; 14 Pages.
Response to U.S. Non-Final Office Action dated Jun. 14, 2019 for U.S. Appl. No. 15/991,491; Response filed Aug. 29, 2019; 11 Pages.
Response to European Rules 161/162 Communication dated Jan. 8, 2020 and Written Opinion dated Nov. 19, 2019 for European Application No. 18723629.4; Response filed Jul. 8, 2020; 13 Pages.
Non-Final Office Action dated Mar. 27, 2020, U.S. Appl. No. 16/280,199, 14 pages.
U.S. Non-Final Office Action dated Jun. 13, 2019 for U.S. Appl. No. 15/600,186; 15 Pages.
U.S. Non-Final Office Action dated Jun. 14, 2019 for U.S. Appl. No. 15/991,491; 15 Pages.
U.S. Final Office Action dated Sep. 26, 2019 for U.S. Appl. No. 15/600,186; 13 Pages.
U.S. Final Office Action dated Sep. 26, 2019 for U.S. Appl. No. 15/991,491; 10 Pages.
Amendment filed Jun. 25, 2020 for U.S. Appl. No. 16/280,199; 12 Pages.
U.S. Appl. No. 16/280,199, filed Feb. 20, 2019, Liu et al.
International Search Report and Written Opinion of the ISA dated Sep. 26, 2019 for International Application No. PCT/US2019/037629; 13 Pages.
U.S. Appl. No. 15/991,491, filed May 29, 2018, Rémy Lassalle-Balier, et al.
U.S. Appl. No. 15/613,313, filed Jun. 5, 2017, Maxim Klebanov, et al.
U.S. Appl. No. 15/600,186, filed May 19, 2017, Campiglio et al.
$2^{nd}$ Supplemental Response filed on Mar. 17, 2021 for U.S. Appl. No. 16/806,028; 24 Pages.
U.S. Notice of Allowance dated Mar. 22, 2021 for U.S. Appl. No. 16/806,028; 11 Pages.
Response to U.S. Non-Final Office Action dated Mar. 8, 2021 for U.S. Appl. No. 15/991,491; Response filed Mar. 23, 2021; 15 Pages.
U.S. Appl. No. 17/089,798, filed Nov. 5, 2020, Liu et al.
Response and Request for Continued Examination (RCE) filed on Aug. 6, 2020 for U.S. Appl. No. 15/991,491; 16 pages.
Preliminary Amendment filed on Mar. 28, 2020 for U.S. Appl. No. 16/280,199; 4 pages.
Restriction Requirement dated Feb. 7, 2020 for U.S. Appl. No. 16/280,199; 6 pages.
Response to Restriction Requirement filed on Feb. 26, 2020 for U.S. Appl. No. 16/280,199; 1 page.
U.S. Non-Final Office Action dated Mar. 8, 2021 for U.S. Appl. No. 15/991,491; 7 Pages.
U.S. Final Office Action dated Mar. 9, 2021 for U.S. Appl. No. 16/806,028; 11 Pages.
Response to U.S. Final Office Action dated Mar. 9, 2021 for U.S. Appl. No. 16/806,028; Response Filed Mar. 10, 2021; 3 Pages.
PCT International Preliminary Report dated Feb. 11, 2021 for International Application No. PCT/US2019/037629; 8 Pages.
U.S. Non-Final Office Action dated Mar. 8, 2021 for U.S. Appl. No. 16/574,419; 13 Pages.

(56) References Cited

OTHER PUBLICATIONS

Yuan et al., "Double-Pinned Magnetic Tunnel Junction Sensors with Spin-Valve-Like Sensing Layers;" Journal of Applied Physics, vol. 118; Published on Aug. 4, 2015; 4 Pages.
Zhang et al., "Large Perpendicular Exchange Bias in CoFeB/MgO Systems Pinned by a Bottom IrMn Layer via an Interfacial CoFe/Ta Composite Layer;" IEEE Transactions on Magnetics, vol. 51, No. 11; Nov. 2015; 4 Pages.
Extended European Search Report dated Jan. 22, 2021 for European Application No. 20192931.2; 11 Pages.
Response to U.S. Non-Final Office Action dated Nov. 19, 2020 for U.S. Appl. No. 16/806,028; Response filed Feb. 5, 2021; 23 Pages.
Supplemental Response to U.S. Final Office Action dated Mar. 9, 2021 for U.S. Appl. No. 16/806,028; Response filed on Mar. 11, 2021; 18 Pages.
U.S. Non-Final Office Action dated Nov. 19, 2020 for U.S. Appl. No. 16/806,028; 9 Pages.
Response to U.S. Non-Final Office Action dated Mar. 8, 2021 for U.S. Appl. No. 16/574,419, Response Filed Apr. 5, 2021; 9 Pages.
Chinese Office Action with English Translation dated Jun. 22, 2021 for Chinese Application No. 201880033084.5; 26 Pages.
Notice of Allowance dated Jun. 11, 2021 for U.S. Appl. No. 16/574,419; 13 Pages.
U.S. Non-Final Office Action dated Aug. 10, 2021 for U.S. Appl. No. 17/089,798; 17 Pages.
U.S. Restriction Requirement dated Apr. 16, 2021 for U.S. Appl. No. 16/684,932; 6 Pages.
Response to U.S. Restriction Requirement dated Apr. 16, 2021 for U.S. Appl. No. 16/684,932; Response filed Apr. 21, 2021; 1 Page.
U.S. Notice of Allowance dated Apr. 19, 2021 for U.S. Appl. No. 15/991,491; 12 Pages.
312 Amendment filed on Jul. 16, 2021 for U.S. Appl. No. 16/574,419; 5 Pages.
U.S. Non-Final Office Action dated Jul. 23, 2021 for U.S. Appl. No. 16/684,932; 14 Pages.
Response to U.S. Non-Final Office Action dated Jul. 23, 2021 for U.S. Appl. No. 16/684,932; Response filed Aug. 30, 2021; 15 Pages.
Response to U.S. Non-Final Office Action dated Aug. 10, 2021 for U.S. Appl. No. 17/089,798; Response filed Oct. 12, 2021; 7 Pages.
U.S. Notice of Allowance dated Oct. 14, 2021 for U.S. Appl. No. 16/684,932; 12 Pages.

* cited by examiner

MAGNETORESISTANCE ASSEMBLY HAVING A TMR ELEMENT DISPOSED OVER OR UNDER A GMR ELEMENT

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to magnetoresistance elements and, more particularly, to a tunneling magnetoresistance (TMR) element disposed under or over a giant magnetoresistance (GMR) element.

BACKGROUND

As used herein, the term "magnetic field sensing element" is used to describe a variety of electronic elements that can sense a magnetic field. One such magnetic field sensing element is a magnetoresistance (MR) element. The magnetoresistance element has a resistance that changes in relation to a magnetic field experienced by the magnetoresistance element.

As is known, there are different types of magnetoresistance elements, for example, a giant magnetoresistance (GMR) element and a tunneling magnetoresistance (TMR) element, also called a magnetic tunnel junction (MTJ) element.

The GMR and the TMR elements operate with spin electronics (i.e., electron spins) where the resistance is related to the magnetic orientation of different magnetic layers separated by nonmagnetic layers. In spin valve configurations, the resistance is related to an angular direction of a magnetization in a so-called "free-layer" relative to another layer so-called "reference layer." The free layer and the reference layer are described more fully below.

The magnetoresistances element may be used as a single element or, alternatively, may be used as two or more magnetoresistance elements arranged in various configurations, e.g., a half bridge or full (i.e., Wheatstone) bridge.

As used herein, the term "magnetic field sensor" is used to describe a circuit that uses one or more magnetic field sensing elements, generally in combination with other circuits. In a typical magnetic field sensor, the magnetic field sensing element and the other circuits can be integrated upon a common substrate, for example, a semiconductor substrate. In some embodiments, the magnetic field sensor can also include a lead frame and packaging.

Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

Various parameters characterize the performance of magnetic field sensors and magnetic field sensing elements. With regard to magnetic field sensing elements, the parameters include sensitivity, which is the change in the output signal of a magnetic field sensing element (or resistance for a magnetoresistance element) in response to a magnetic field, and linearity, which is the degree to which the output signal (or resistance) of a magnetic field sensing element varies linearly (i.e., in direct proportion) to the magnetic field. The parameters also include offset, which describes and output from the magnetic field sensing element that is not indicative of zero magnetic field when the magnetic field sensor experiences a zero magnetic field.

GMR and TMR elements are known to have a relatively high sensitivity, compared, for example, to Hall Effect elements. Thus, for example, a current sensor that uses GMR or TMR elements can sense smaller currents than can a current sensor that uses Hall Effect elements.

TMR elements are known to have a higher sensitivity than GMR elements, but at the expense of higher noise at low frequencies.

Both TMR elements and a GMR elements have respective linear ranges but saturate at higher magnetic fields.

Conventionally, GMR and TMR elements are each disposed over different respective substrates, for example, semiconductor substrates, and each is fabricated as a different respective set of deposited layers. Because the layers of GMR elements and TMR elements are different, conventionally, it can be very difficult to deposit layers of a GMR and a TMR element on the same substrate.

It would however, be desirable to provide GMR and TMR elements deposited over the same substrate.

SUMMARY

The present invention provides GMR and TMR elements deposited over the same substrate.

In accordance with an example useful for understanding an aspect of the present invention, a magnetoresistance assembly can include a substrate, a first GMR element disposed over the substrate, the first GMR element having a bottom surface and top surface; and a first TMR element disposed over the substrate. The first TMR element can have a top surface and a bottom surface. A line perpendicular to and intersecting the top or bottom surface of the first TMR element intersects the top or bottom surface of the first GMR element. The first GMR element and the first TMR element can be in electrical communication.

In accordance with an example useful for understanding an aspect of the present invention, a method for forming a magnetoresistance assembly upon a substrate can include forming a first GMR element disposed over the substrate, the first GMR element having a bottom surface and top surface. The method can also include forming a first TMR element disposed over the substrate, the first TMR element having a top surface and a bottom surface, wherein a line perpendicular to and intersecting the top or bottom surface of the first TMR element intersects the top or bottom surface of the first GMR element, and wherein the first GMR element and the first TMR element are in electrical communication.

BRIEF DESCRIPTION OF THE DRAWINGS

The foregoing features of the invention, as well as the invention itself may be more fully understood from the following detailed description of the drawings, in which.

DETAILED DESCRIPTION

Figure 1:
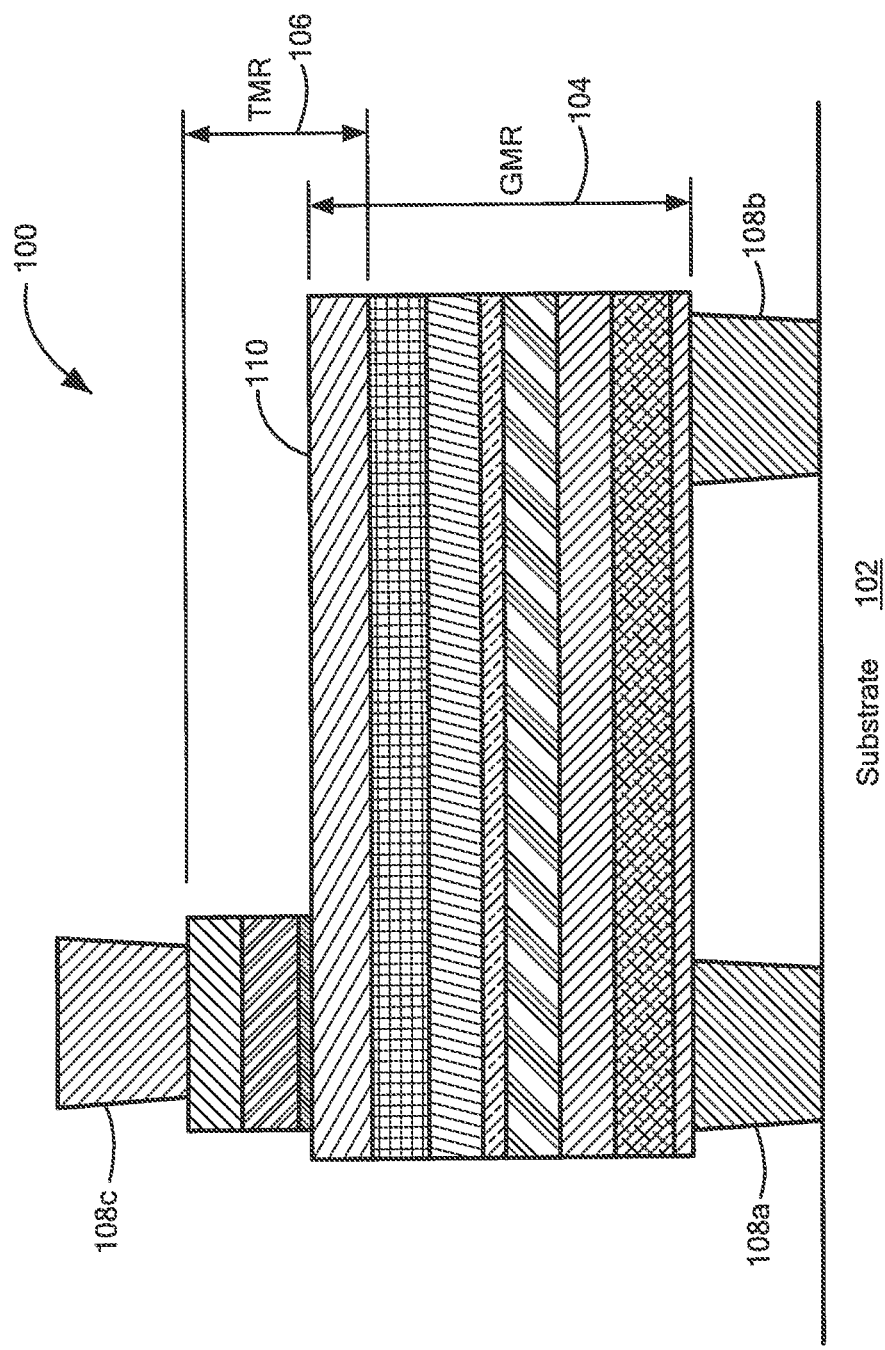
FIG. 1 is a block diagram showing side a view of an illustrative magnetoresistance assembly comprised of a TMR element disposed over a GMR element, each having a respective plurality of layers.

Before describing the present invention, it should be noted that reference is sometimes made herein to magnetoresistance assemblies having a particular shape (e.g., cylindrical, rectangular, or yoke-shaped). One of ordinary skill in the art will appreciate, however, that the techniques described herein are applicable to a variety of sizes and shapes.

Before describing the present invention, some introductory concepts and terminology are explained.

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a giant magnetoresistance (GMR) element, for example, a spin valve, a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR) and vertical Hall elements tend to have axes of sensitivity parallel to a substrate. However, some TMR elements can have axes of sensitivity perpendicular to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

The terms "parallel" and" perpendicular" are used in various contexts herein. It should be understood that the terms parallel and perpendicular do not require exact perpendicularity or exact parallelism, but instead it is intended that normal manufacturing tolerances apply, which tolerances depend upon the context in which the terms are used. In some instances, the term "substantially" is used to modify the terms "parallel" or "perpendicular." In general, use of the term "substantially" reflects angles that are beyond manufacturing tolerances, for example, within +/− ten degrees.

GMR elements and TMR elements described below are shown to have a common shared pinning layer. However, it should be appreciated that, in other embodiments, the common shared pinning layer can be replaced with different respective pinning layers.

GMR elements and TMR elements, both single pinned and double pinned, are shown in figures below. However, it should be appreciated that single and double pinned GMR and TMR elements can be formed having different numbers of layers, layers with different materials, and/or layers with different thicknesses than those shown below.

Referring to FIG. 1, an illustrative magnetoresistance assembly 100 can include a substrate 102, for example, a semiconductor substrate, a GMR element 104 disposed over the substrate 102, and a TMR element 106 disposed over the GMR element 104. Electrical contacts 108a, 108b can be coupled to a bottom of the GMR element 104. An electrical contact 108c can be coupled to a top of the TMR element 106. A line perpendicular to a top surface of the TMR element 106 and passing through the TMR element 106 intersects the GMR element The GMR element 104 and the TMR element 106 can each comprise a respective plurality of layers. Examples of the pluralities of layers are shown below in conjunction with FIG. 3-6. In some embodiments, the GMR element 104 and the TMR element 106 can include a common layer 110, which, as shown in figures below, can be a common antiferromagnetic pinning layer, e.g., a layer of PtMn or IrMn.

Figure 2:
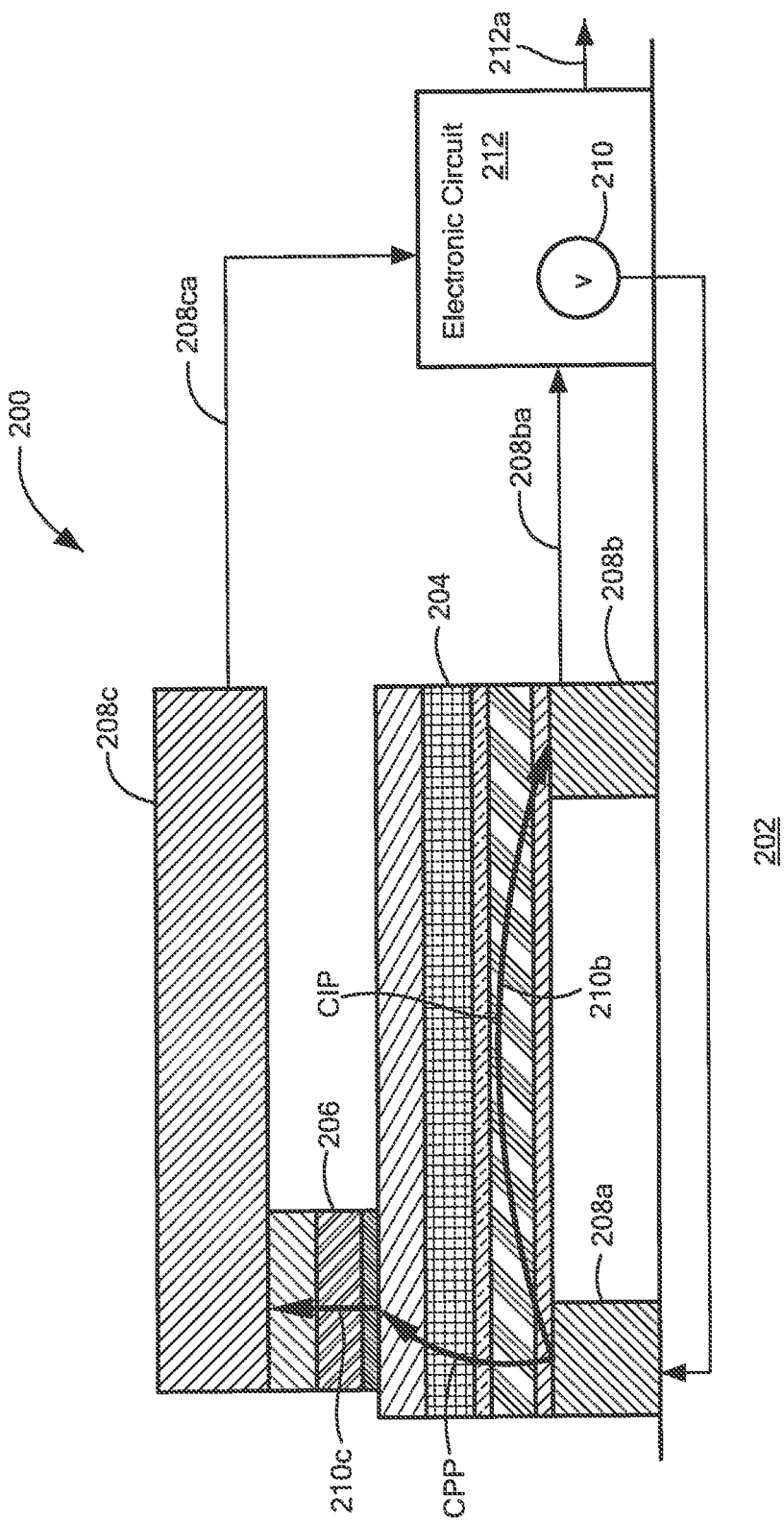
FIG. 2 is a block diagram showing a side view of another illustrative magnetoresistance assembly comprised of a TMR element disposed over a GMR element, each having a respective plurality of layers; having three electrical contacts, and showing a current in plane (CIP) and a current perpendicular to the plane (CPP), where the plane is a plane of a substrate under the GMR element.

Referring to FIG. 2, another illustrative magnetoresistance assembly 200 can include a substrate 202, for example, a semiconductor substrate, a GMR element 204 disposed over the substrate 202, and a TMR element 206 disposed over the GMR element 204. A line perpendicular to a top surface of the TMR element 206 and passing through the TMR element 206 intersects the GMR element 204.

Electrical contacts 208a, 208b can be coupled to a bottom surface of the GMR element 204. An electrical contact 208c can be coupled to a top of the TMR element 106.

A voltage source 210, or in other embodiments, a current source, can generate a voltage 210a (or a current) coupled to the electrical contact 208a, which can result in a currents 210b, 210c. The current 210b can be a so-called in "current in plane" or CIP and can flow through the GMR element 204 generally in a direction parallel to a plane of the substrate 202 and out of the electrical contact 208b. The current 210c can be a so-called in "current perpendicular to the plane" or CPP and can flow through the TMR element 206 generally in a direction perpendicular to a plane of the substrate 202 and out of the electrical contact 208c.

In some embodiments, the contacts 208b, 208c can be coupled to an electronic circuit 212, which can be disposed upon or within the substrate 202. The electronic circuit 212 can receive a GMR signal 208ba from the GMR element 204 and can receive a TMR signal 208ca from the TMR element 206. The electronic circuit 212 can be operable to identify, at the same time or individually, resistances of the GMR element 204 and of the TMR element 206, each of which are responsive to an external magnetic field. For example, the electronic circuit 212 can include a first fixed resistor coupled to receive the current 210b and operable to generate a first voltage proportional to the current 210b, which is proportional to a resistance of the GMR element 204. The electronic circuit 212 can include a second fixed resistor coupled to receive the current 210c and operable to generate a second voltage proportional to the current 210c, which is proportional to a resistance of the TMR element 206.

With this arrangement, both the GMR element 204 and the TMR element 206 can be electrically active and responsive to magnetic fields at the same time. However, in other embodiments, it should be understood that the electronic circuit 212 can open circuit either one of the currents 210b, 210c, in which case, the GMR element 204 and the TMR element 206 can be electrically active at different times but using the same voltage source 210 or current source.

As described above, TMR elements tend to have higher sensitivities to external magnetic fields (e.g., Ohms per Gauss) than GMR elements. Thus, some magnetic field sensors that use the magnetoresistance assembly 200 can use the TMR element 206 when sensing smaller magnetic fields and can use the GMR element 204 when sensing higher magnetic fields. Thus, the electronic circuit 212 (within a magnetic field sensor) can have two different operating ranges (e.g., ranges of Gauss), which ranges may or may not overlap.

It should be apparent that fabricating the magnetoresistance element 200 is easier than fabricating separate GMR and TMR elements, both disposed directly on the same substrate but side-by-side. Essentially, the magnetoresistance assembly 200 can be fabricated by sequentially depositing layers of materials that are described more fully in figures below. A side-by-side arrangement would require that the GMR element and the TMR element be separately fabricated with additional masking steps and associated higher cost.

Figure 3:
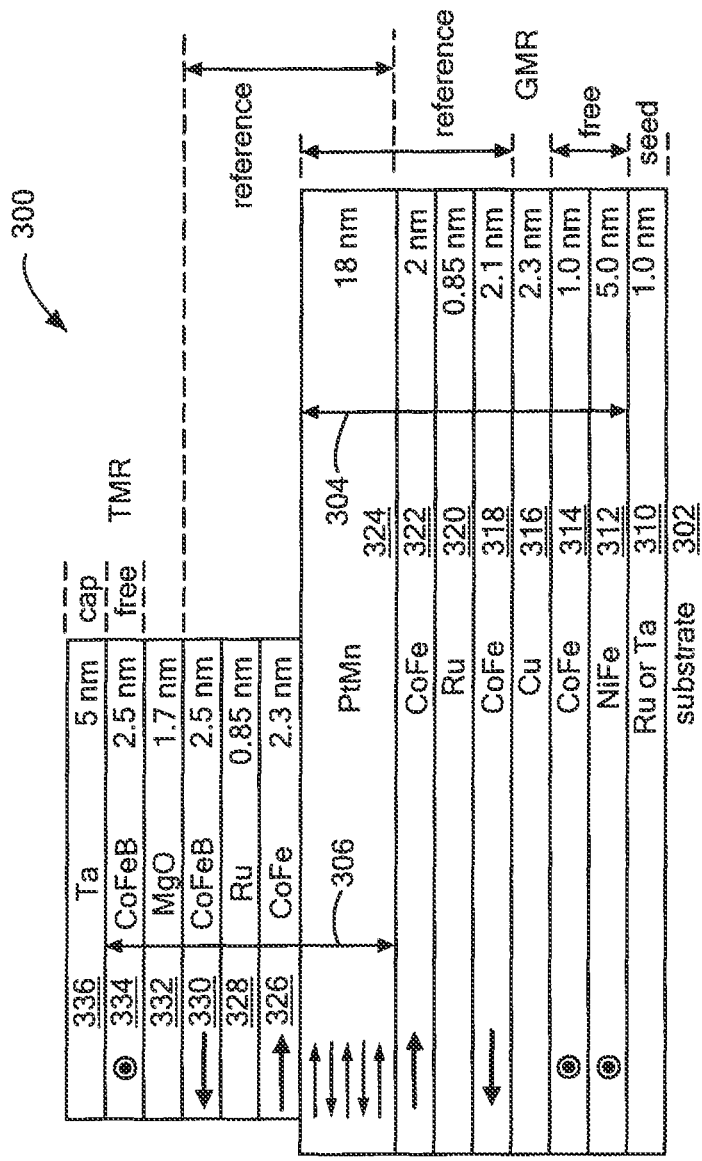
FIG. 3 is a block diagram showing a side view of another illustrative magnetoresistance assembly comprised of a single pinned TMR element disposed over a single pinned GMR element, each having a respective plurality of layers.

Referring to FIG. 3, another illustrative magnetoresistance assembly 300 can include a substrate 302, for example, a semiconductor substrate, a single pinned GMR element 304 disposed over the substrate 302, and a single pinned TMR element 306 disposed over the GMR element 304. A line perpendicular to a top surface of the TMR element 306 and passing through the TMR element 306 intersects the GMR element 304. Electrical contacts are not shown but should be understood from the discussion above in conjunction with FIGS. 1 and 2.

Single pinned GMR and TMR elements will be understood to each have a respective reference layer structure and a respective free layer structure, for which the free layer structure can be a single layer or can have multiple layers. As used herein, depending upon context, the term "layer structure" is used to describe a single layer of one material, or multiple coupled layers, each coupled layer having a different material.

The GMR element 304 can have a reference layer structure that can include an antiferromagnetic pinning layer 324 (e.g., PtMn or IrMn) and a pinned layer structure 322, 320, 318 magnetically coupled to the pinning layer 324 and taking on a magnetic direction of the pinning layer 324 indicated by an arrow. Spacer layer 320 has a material and thickness selected to result in antiferromagnetic coupling between the layers 322 and 318. The layers 322, 320, 318 can be referred to as a synthetic antiferromagnet (SAF).

A free layer structure 314, 312 of the GMR element 304 can take on a magnetic direction of an external magnetic field. In the absence of an external magnetic field, the free layer structure 314, 312 can take on a magnetic direction out of the page as indicated by arrow heads. The direction out to the page can be determined according to a shape anisotropy of the GMR element 304, i.e., the GMR element 304 can be formed in the shape of a yoke from a top view, where a longest dimension of the yoke extends in a direction into and out of the page. A yoke shape is described more fully below in conjunction with FIG. 8.

The TMR element 304 can have a reference layer structure that can include the antiferromagnetic pinning layer 324 (e.g., PtMn or IrMn) and a pinned layer structure 326, 328, 330 magnetically coupled to the pinning layer 324 and taking on a magnetic direction of the pinning layer 324 indicated by arrows. Spacer layer 328 has a material and thickness selected to result in antiferromagnetic coupling between the layers 326 and 330. The layers 326, 328, 330 can be referred to as a synthetic antiferromagnet (SAF).

A free layer structure 334 of the TMR element 306 can take on a magnetic direction of an external magnetic field. In the absence of an external magnetic field, the free layer structure 334 can take on a magnetic direction that is indeterminate but is here shown out of the page as indicated by an arrow head. The indeterminate direction can be due to a lack of shape anisotropy, since the TMR element 306 may be cylindrical or rectangular from a top view.

A seed layer 310 can be disposed under the free layer structure 314, 312. A cap layer 336 can be disposed over the free layer 334.

Both the GMR element 304 and the TMR element 306 can have maximum response axes parallel to a magnetic direction of the pinning layer 324.

Examples of materials of the layers and layer thicknesses are shown. However, as described above, other GMR elements and other TMR elements can be used that use other materials with other thicknesses. Also, other structures of GMR and TMR elements can be used. Only some of the other structures are shown in figures below.

Figure 4:
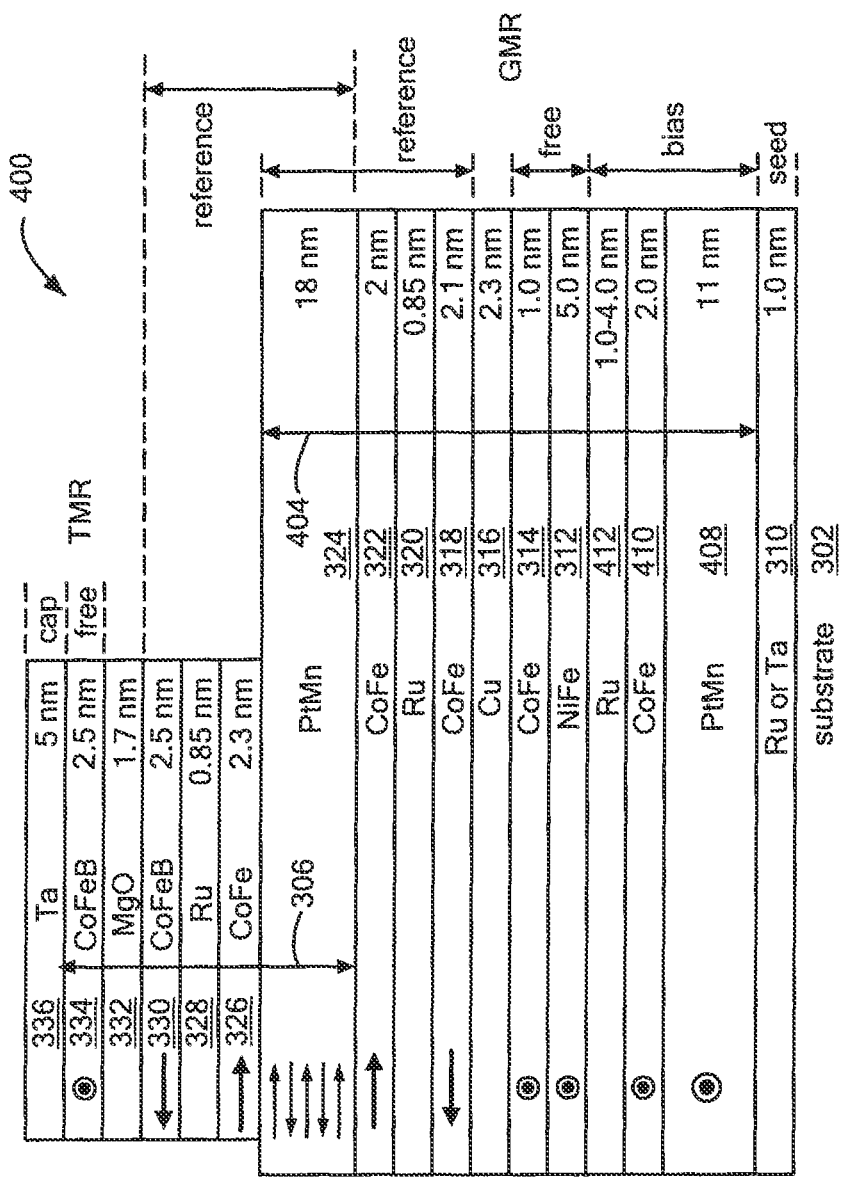
FIG. 4 is a block diagram showing a side view of another illustrative magnetoresistance assembly comprised of a single pinned TMR element disposed over a double pinned GMR element, each having a respective plurality of layers.

Referring now to FIG. 4 in which like elements of FIG. 3 are shown having like reference designations, a magnetoresistance assembly 400 can be similar to the magnetoresistance assembly 300 and can use the same single pinned TMR element 306 as the single pinned TMR element 306. Here, however, a GMR element 404 is double pinned. A line perpendicular to a top surface of the TMR element 306 and passing through the TMR element 306 intersects the GMR element 404.

To the magnetoresistance assembly 300 of FIG. 3, a bias layer structure is added, having a second pinning layer 408 (e.g., PtMn or IrMn), a pinned layer 410, and a spacer layer 412. The pinned layer 410 magnetically coupled to the pinning layer 408 and can take on a magnetic direction of the pinning layer 408 indicated by an arrowhead.

The spacer layer 412 can be comprised of a material and can have a thickness that results in ferromagnetic coupling between the pinned layer 410 and the free layer structure 312, 314.

Electrical contacts are not shown but should be understood from the discussion above in conjunction with FIGS. 1 and 2.

Both the GMR element 404 and the TMR element 306 can have maximum response axes parallel to a magnetic direction of the pinning layer 324.

Figure 5:
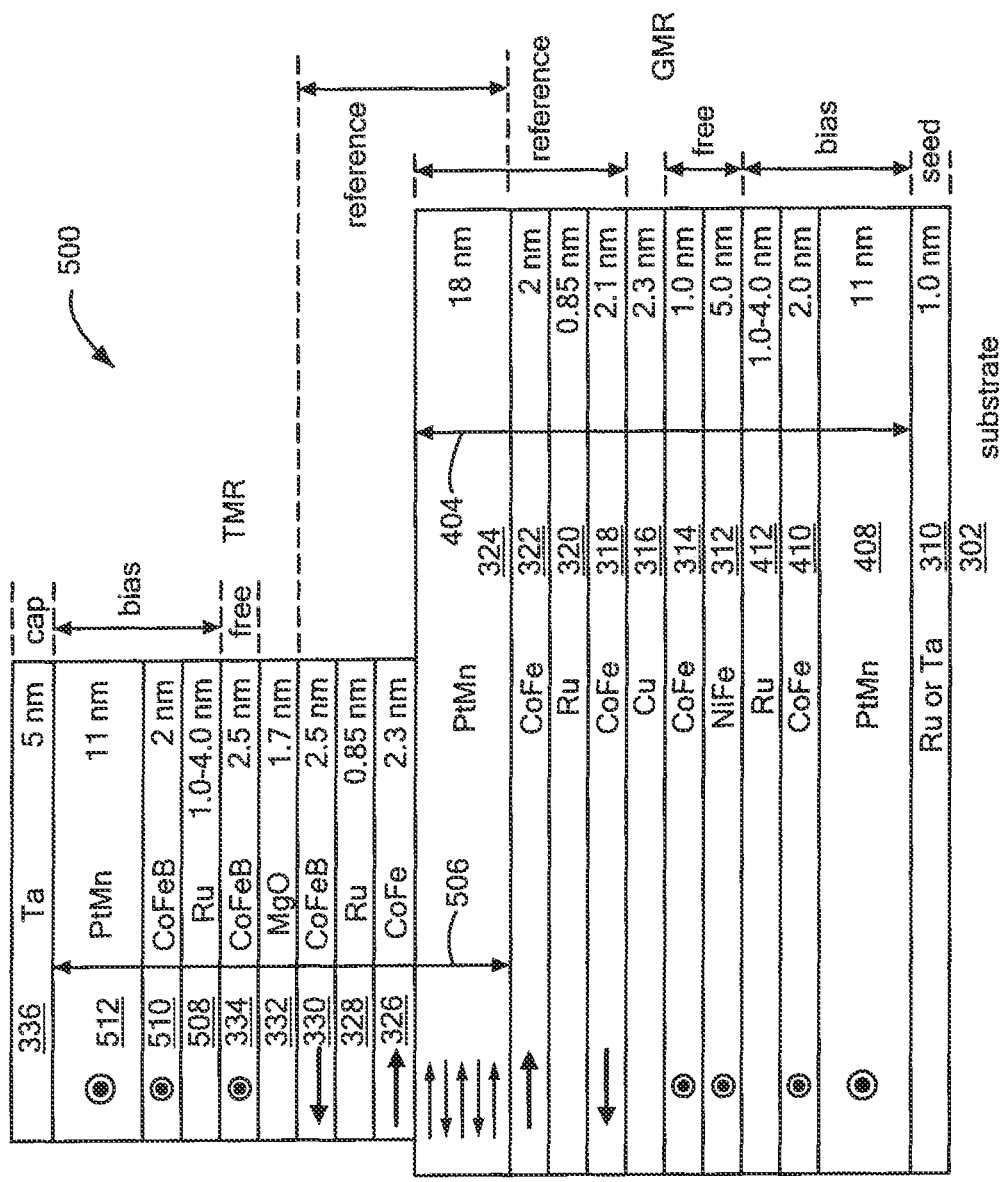
FIG. 5 is a block diagram showing a side view of another illustrative magnetoresistance assembly comprised of a double pinned TMR element disposed over a double pinned GMR element, each having a respective plurality of layers.

Referring now to FIG. 5 in which like elements of FIGS. 3 and 4 are shown having like reference designations, a magnetoresistance assembly 500 can be similar to the magnetoresistance assembly 400 and can use the same double pinned GMR element 404. Here, however, a TMR element 506 is double pinned. A line perpendicular to a top surface of the TMR element 506 and passing through the TMR element 506 intersects the GMR element 404.

To the magnetoresistance assembly 400 of FIG. 4, a bias layer structure is added, having a third pinning layer 512 (e.g., PtMn or IrMn), a pinned layer structure 510, and a spacer layer 508. The pinned layer 510 can be magnetically coupled to the pinning layer 512 and can take on a magnetic direction of the pinning layer 512 indicated by an arrowhead.

Spacer layer 508 can be comprised of a material and can have a thickness that results in ferromagnetic coupling between the pinned layer 510 and the free layer 334. An external magnetic field can move the magnetic direction of the free layer 334 to a different direction.

Electrical contacts are not shown but should be understood from the discussion above in conjunction with FIGS. 1 and 2.

Both the GMR element 404 and the TMR element 506 can have maximum response axes parallel to a magnetic direction of the pinning layer 324.

Figure 6:
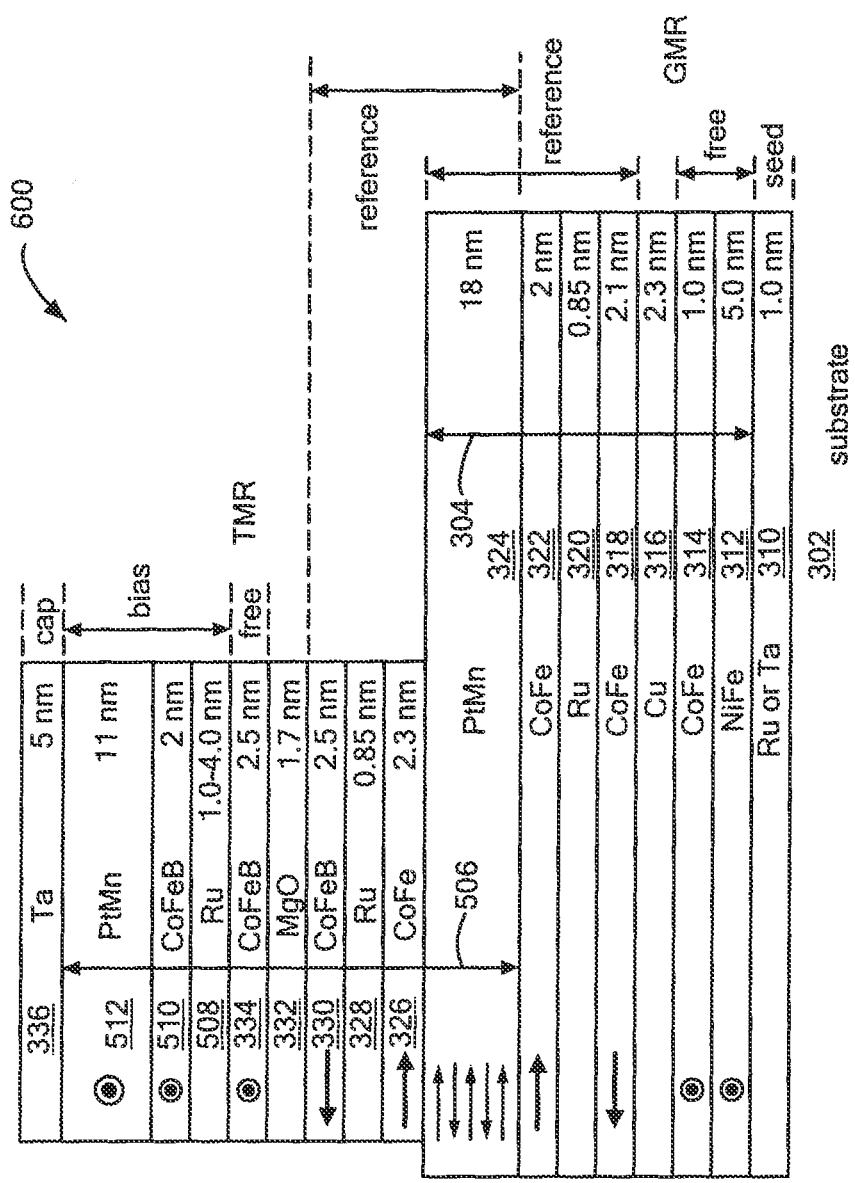
FIG. 6 is a block diagram showing a side view of another illustrative magnetoresistance assembly comprised of a double pinned TMR element disposed over a single pinned GMR element, each having a respective plurality of layers.

Referring now to FIG. 6 in which like elements of FIGS. 3, 4, and 5 are shown having like reference designations, a magnetoresistance assembly 600 can include the double pinned GMR element 304 of FIG. 3 disposed under the double pinned TMR element 506 of FIG. 5. A line perpendicular to a top surface of the TMR element 506 and passing through the TMR element 506 intersects the GMR element 304.

Electrical contacts are not shown but should be understood from the discussion above in conjunction with FIGS. 1 and 2.

Both the GMR element 304 and the TMR element 506 can have maximum response axes parallel to a magnetic direction of the pinning layer 324.

While embodiments shown above have a TMR element disposed over a GMR element, in other embodiments, the GMR element can be disposed over the TMR element. One such arrangement is described below in conjuncitOno with FIGS. 11 and 12.

Figure 7:
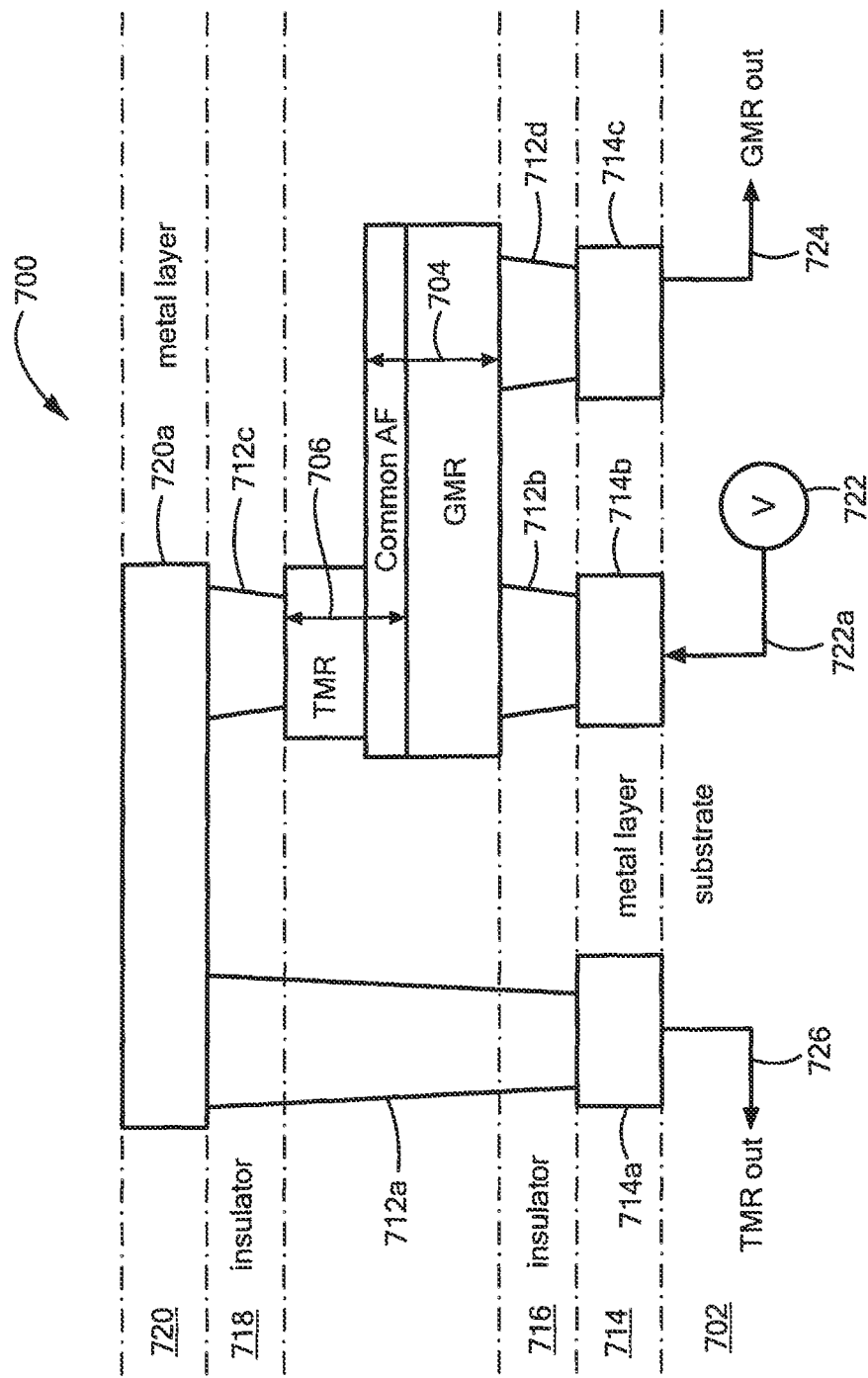
FIG. 7 is a block diagram showing a side view of another illustrative magnetoresistance assembly comprised of a TMR element disposed over a GMR element, having electrical contacts, and having couplings to metal layers disposed over a substrate.

Referring now to FIG. 7, a magnetoresistance assembly 700 disposed upon a substrate 702, can include a GMR element 704 disposed under a TMR element 706. The GMR element 704 and the TMR element 706 can have a common antiferromagnetic pinning layer labeled as a common AF layer. The magnetoresistance assembly 700 can be the same as or similar to any of the magnetoresistance assemblies described above.

The GMR element 704 can include first and second electrical contacts 712b, 712d, respectively, which may be plated or conductively filled vias, and which can be disposed under a bottom surface of the GMR element 704 proximate to the substrate 702. The first and second electrical contacts 712d, 712d, can be coupled to first and second portions 714b, 714c, respectively, of a first metal layer 714 disposed over the substrate 702, e.g., between the substrate 702 and a bottom surface of GMR element 704.

The TMR element 706 can include an electrical contact 712c, which may be a plated or conductively filled via, and which can be disposed over a top surface of the TMR element 706 distal from the substrate 702. The electrical contact 712c can be coupled to a portion 720a of a second metal layer 720 disposed over the substrate 702, e.g., over the top surface of the TMR element 706.

In some embodiments, the portion 720a of the second metal layer 720 can be coupled through a plated or conductively filled via 712a to a third portion 714a of the first metal layer 714.

A voltage generator 722 or a current generator can generate a current 722a coupled to the first portion 714b of the first metal layer 714.

It should be understood that the portions 714a, 714b, 714c of the first metal layer 714 can be electrically separate, such that the current 722a can be received at the first portion 714a of the first metal layer 714, a GMR output signal 724 can be generated at the second portion 714c of the first metal layer 714, and a TMR output signal 726 can be generated at the third portion 714a of the first metal layer 714. Other metal layers and other connection schemes are also possible.

A first current portion of the current 722a can travel across the GMR element 704 to generate the GMR output signal 724. A second current portion of the current 722a can travel upward through the GMR element 704 and upward through the TMR element 706 to generate the TMR output signal 726. The GMR element is not responsive, or is minimally responsive, to the second current portion passing upward through the GMR element 704.

As described above, the GMR output signal 724 and the TMR output signal 726 can be generated at the same time. However, it is also possible to time multiplex the GMR output signal 724 and the TMR output signal 726, for example, by blocking currents of the GMR output signal 724 and the TMR output signal 726, one at a time. The blocking can be facilitated with electronic switches. It is also possible to generate only one of the GMR output signal 724 or the TMR output signal 726 by blocking current from the other one of the GMR output signal 724 or the TMR output signal 726.

Figure 8:
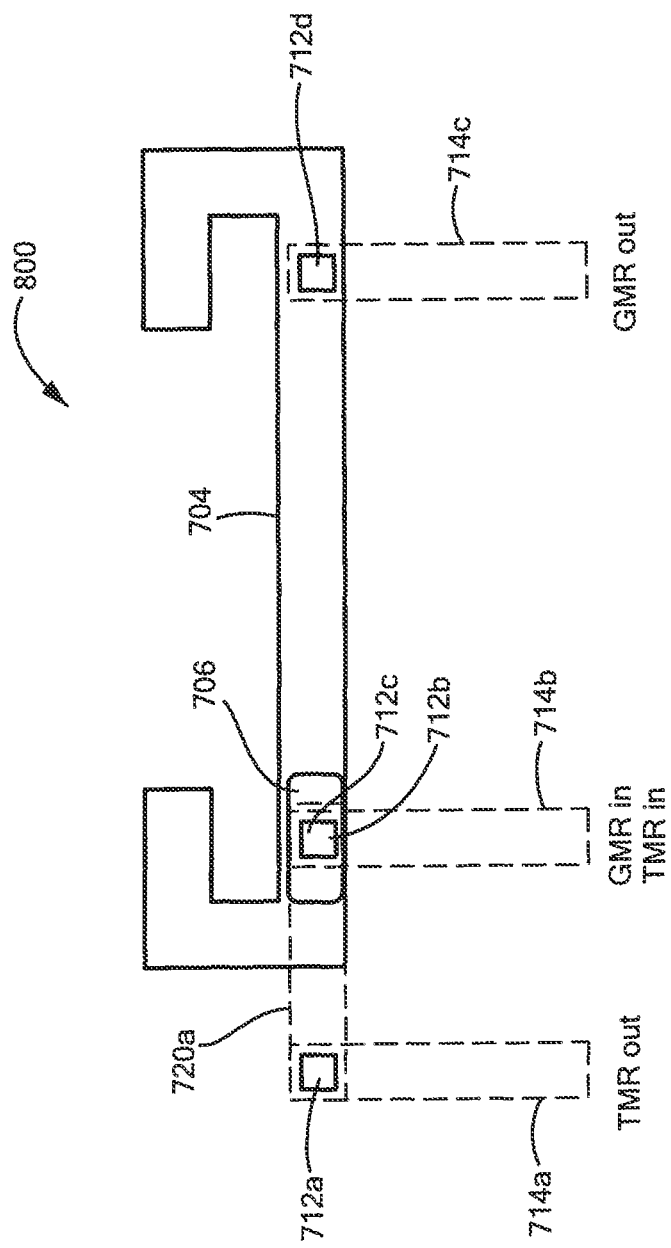
FIG. 8 is a block diagram showing a top view of the magnetoresistance element assembly of FIG. 7.

Referring now to FIG. 8, in which like elements of FIG. 7 are shown having like reference designations, GMR element 704 and TMR element 706 are shown from a top view. The GMR element 704 can have a yoke shape. The TMR element 706 can have a rectangular shape. Other shapes are also possible.

Figure 9:
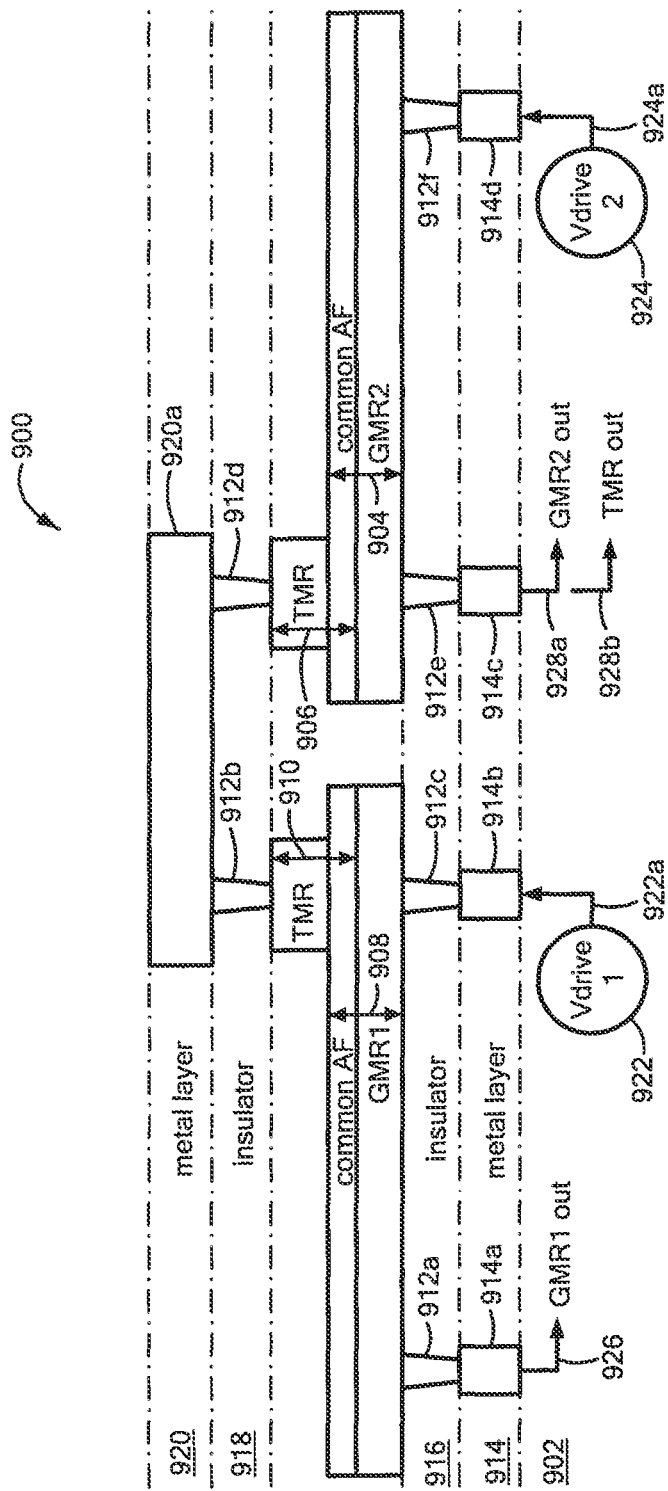
FIG. 9 is a block diagram showing a side view of another illustrative magnetoresistance assembly comprised of first and second TMR elements disposed over first and second GMR elements, respectively, having electrical contacts, and having couplings to metal layers disposed over a substrate.

Referring now to FIG. 9, a magnetoresistance assembly 900 can include more than one GMR element and more than one TMR element. Here, two GMR elements 904, 908, and two TMR elements 906, 910 are shown, but greater numbers can also be provided. A line perpendicular to a top surface of the TMR element 906 and passing through the TMR element 906 intersects the GMR element 904. A line perpendicular to a top surface of the TMR element 910 and passing through the TMR element 910 intersects the GMR element 908.

The magnetoresistance assembly 900, can be disposed upon a substrate 902, and can include the GMR element 904 disposed under the TMR element 906, and can include the GMR element 908 disposed under the TMR element 910. The GMR element 904 and the TMR element 906 can have a common antiferromagnetic pinning layer labeled as a common AF layer. The GMR element 908 and the TMR element 910 can have a common antiferromagnetic pinning layer also labeled as a common AF layer. The GMR elements 904, 908 and the TMR elements 906, 910 can be the same as or similar to any of the GMR elements and TMR elements described above.

The GMR element 904 can include first and second electrical contacts 912e, 912f, respectively, which may be plated or conductively filled vias, and which can be disposed under a bottom surface of the GMR element 904 proximate to the substrate 902. The first and second electrical contacts 912e, 912f can be coupled to first and second portions 914c, 914d, respectively, of a first metal layer 914 disposed over the substrate 902, e.g., between the substrate 902 and the bottom surface of GMR element 904.

The TMR element 906 can include an electrical contact 912d, which may be a plated or conductively filled via, and which can be disposed over and coupled to a top surface of the TMR element 906 distal from the substrate 902. The electrical contact 912d can be coupled to a portion 920a of a second metal layer 920 disposed over the substrate 902, e.g., over the top surface of the TMR element 906.

A voltage generator 924 or a current generator can generate a current 924a coupled to the first portion 914d of the first metal layer 914.

The magnetoresistance assembly 900, can include the GMR element 908 disposed under the TMR element 910. The GMR element 908 and the TMR element 910 can have a common antiferromagnetic pinning layer labeled as a common AF layer. The GMR element 908 and the TMR element 910 can be the same as or similar to any of the GMR elements and TMR elements described above.

The GMR element 908 can include first and second electrical contacts 912c, 912a, respectively, which may be plated or conductively filled vias, and which can be disposed under a bottom surface of the GMR element 908 proximate to the substrate 902. The first and second electrical contacts 912c, 912a can be coupled to third and fourth portions 914b, 914a, respectively, of the first metal layer 914 disposed over the substrate 902, e.g., between the substrate 902 and the bottom surface of GMR element 908.

The TMR element 910 can include an electrical contact 912b, which may be a plated or conductively filled via, and which can be disposed over and coupled to a top surface of the TMR element 910 distal from the substrate 902. The electrical contact 912b can be coupled to the portion 920a of the second metal layer 920 disposed over the substrate 902, e.g., over the top surface of the TMR element 910. In other embodiments, the electrical contact 912b can be coupled to a different portion, electrically separate from the portion 920a, of the second metal layer 920.

A voltage generator 922 or a current generator can generate a current 922a coupled to the third portion 914b of the first metal layer 914.

It should be understood that the portions 914a, 914b, 914c, 914d of the first metal layer 914 can be electrically separate, such that the current 922a can be received at the portion 914b of the first metal layer 914, the current 924a can be received at the portion 914d of the first metal layer 914, a first GMR output signal 926 can be generated at the portion 914a of the first metal layer 914, a second GMR output signal 928a can be generated at the portion 914c of the first metal layer 914, and a TMR output signal 928 can be generated at the portion 914c of the second metal layer 914. Other metal layers and other connection schemes are also possible.

With this arrangement, it should be understood that the current 922a results in the GMR output signal 926 and also the TMR output signals 928b. It should also be understood that the current 924a results in the GMR output signal 928a. In some embodiments, the two current signals 922a, 924a are applied at different times, e.g., time multiplexed. In other embodiments, the two current signals 922a, 924a are applied at the same time. In these embodiments, the two output signals 928a, 928b can exist simultaneously as a sum of the signals.

In other embodiments, the first and second TMR elements 906, 910, respectively, can generate separate output signals at separate portions of the second metal layer 920.

Figure 10:
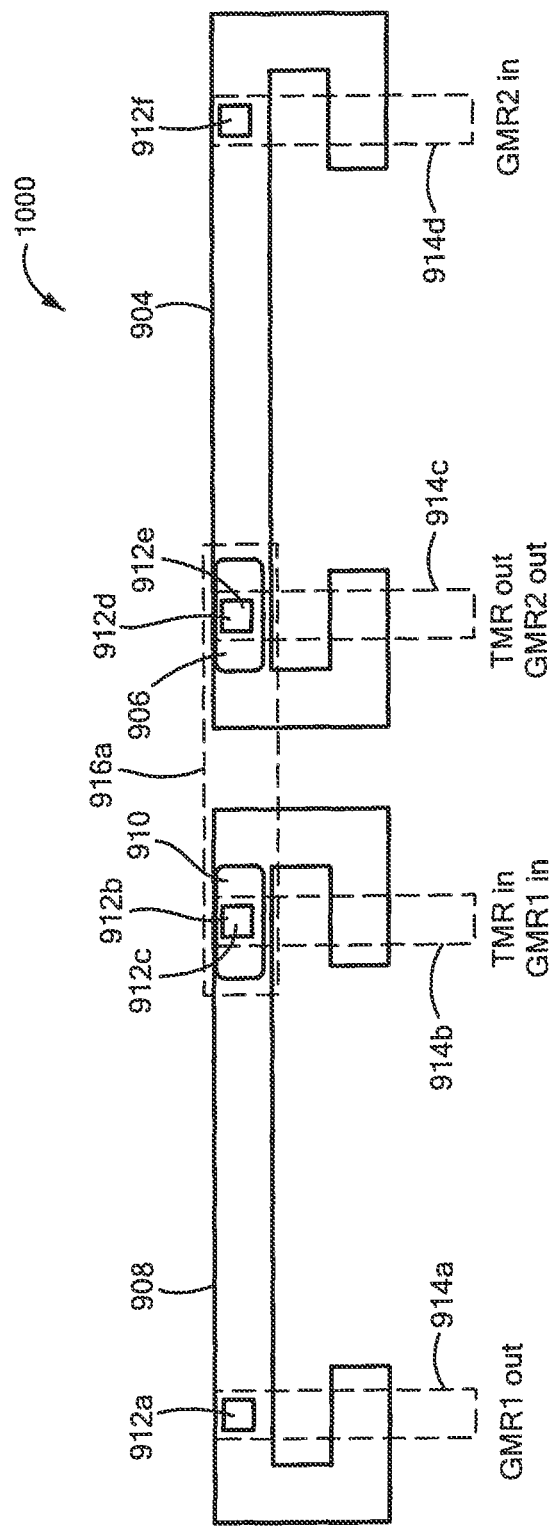
FIG. 10 is a block diagram showing a top view of the magnetoresistance element assembly of FIG. 9.

Referring now to FIG. 10, in which like elements of FIG. 9 are shown having like reference designations, GMR elements 904, 908 and TMR elements 906, 910 OF FIG. 9 are shown from a top view. The GMR elements 904, 908 can each have a yoke shape. The TMR elements 906, 910 can each have a rectangular shape. Other shapes are also possible.

Figure 11:
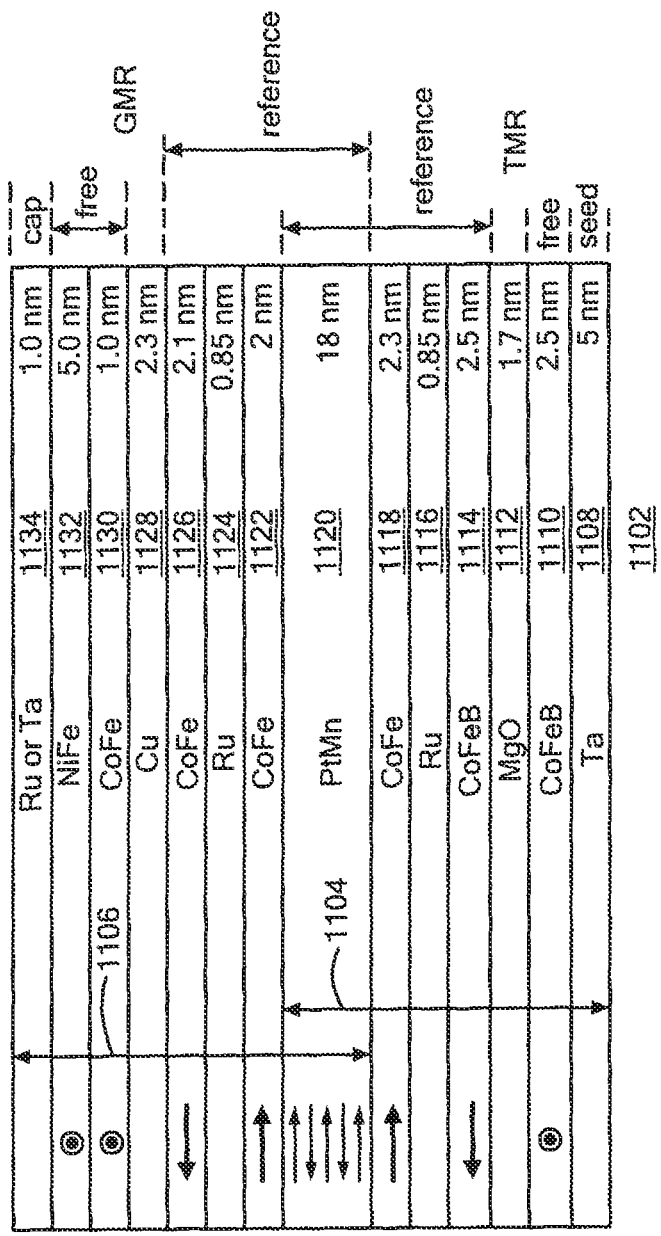
FIG. 11 is a block diagram showing a side view of another illustrative magnetoresistance assembly comprised of a TMR element disposed under a GMR element, having electrical contacts, and having couplings to metal layers disposed over a substrate.

Referring now to FIG. 11, another illustrative magnetoresistance assembly 1100 can include a substrate 1102, for example, a semiconductor substrate, a single pinned TMR element 1104 disposed over the substrate 1102, and a single pinned GMR element 1106 disposed over the GMR element 1104. Electrical contacts are not shown but should be understood from the discussion above in conjunction with FIGS. 1 and 2. A line perpendicular to a bottom surface of the TMR element 1104 and passing through the TMR element 1104 intersects the GMR element 1106.

The GMR element 1106 can have a reference layer structure that can include an antiferromagnetic pinning layer 1120 (e.g., PtMn or IrMn) and a pinned layer structure 1122, 1124, 1126 magnetically coupled to the pinning layer 1120 and taking on a magnetic direction of the pinning layer 1120 indicated by an arrow. Spacer layer 1124 has a material and thickness selected to result in antiferromagnetic coupling between the layers 1122, 1126.

A free layer structure 1130, 1132 of the GMR element 1106 can take on a magnetic direction of an external magnetic field. In the absence of an external magnetic field, the free layer structure 1130, 1132 can take on a magnetic direction out of the page as indicated by arrow heads. The direction out to the page can be determined according to a shape anisotropy of the GMR element 1106, i.e., the GMR element 1106 can be formed in the shape of a yoke from a top view, where a longest dimension of the yoke extends in a direction into and out of the page. A yoke shape is described more fully below in conjunction with FIG. 8 above.

The TMR element 1104 can have a reference layer structure that can include the antiferromagnetic pinning layer 1120 (e.g., PtMn or IrMn) and a pinned layer structure 1118, 1116, 1114 magnetically coupled to the pinning layer 1120 and taking on a magnetic direction parallel to a magnetic direction of the pinning layer 1120 indicated by arrows. Spacer layer 1116 has a material and thickness selected to result in antiferromagnetic coupling between the layers 1118 and 1114.

A free layer 1112 of the TMR element 1104 can take on a magnetic direction of an external magnetic field. In the absence of an external magnetic field, the free layer structure 1110 can take on a magnetic direction that is indeterminate but is here shown out of the page as indicated by an arrow head. The indeterminate direction can be due to a lack of shape anisotropy, since the TMR element 1104 may be cylindrical or rectangular from a top view.

A seed layer 1108 can be disposed under the free layer 1110. A cap layer 1134 can be disposed over the free layer structure 1134.

Both the GMR element 1106 and the TMR element 1108 can have maximum response axes parallel to a magnetic direction of the pinning layer 1120.

Examples of materials of the layers and layer thicknesses are shown. However, as described above, other GMR elements and other TMR elements can be used that use other materials with other thicknesses. Also, other structures of GMR and TMR elements can be used. Only some of the other structures are shown in figures below.

Figure 12:
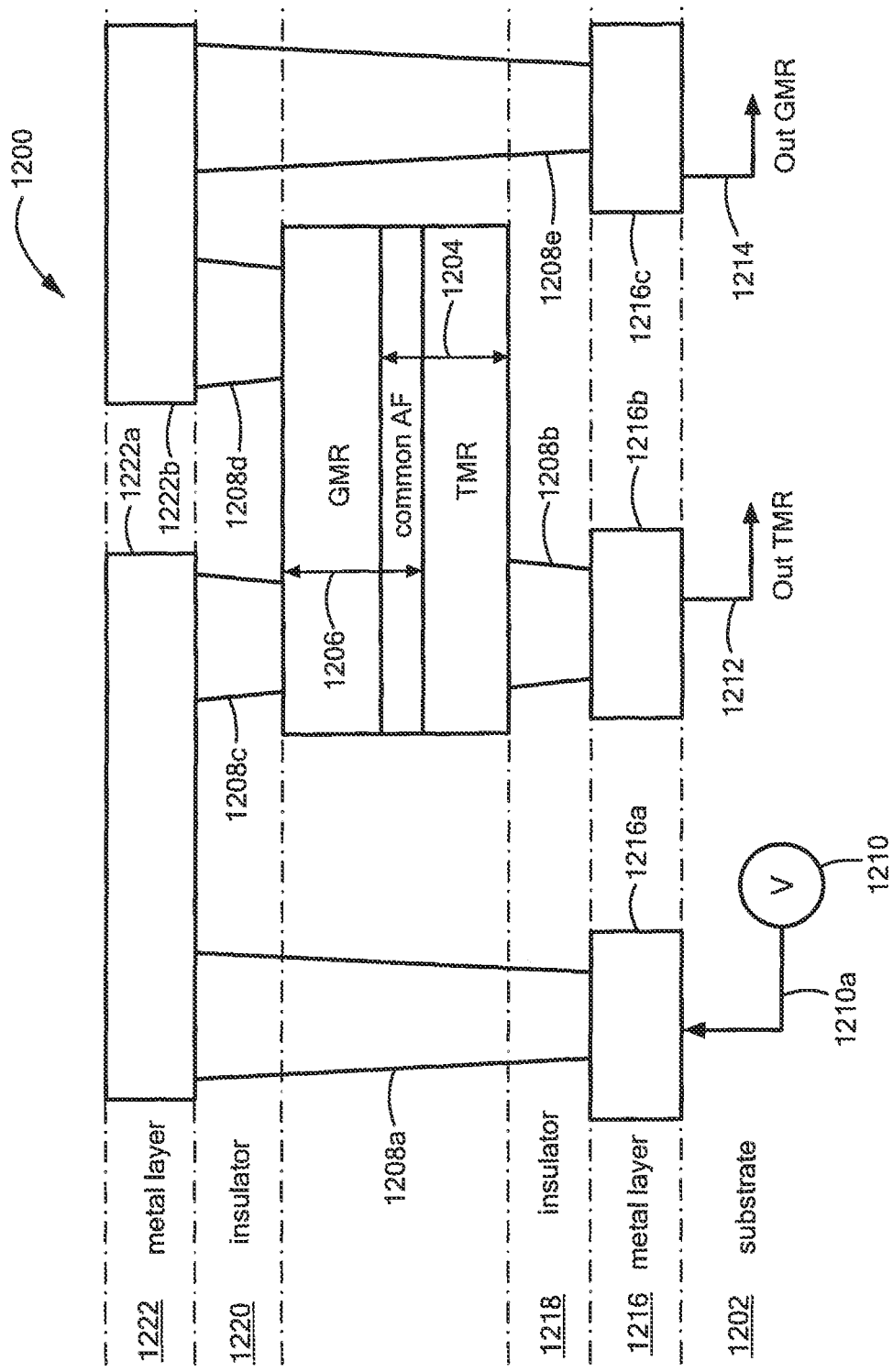
FIG. 12 is a block diagram showing a top view of the magnetoresistance element assembly of FIG. 11.

Referring now to FIG. 12, a magnetoresistance assembly 1200 disposed upon a substrate 1202, can include a TMR element 1204 disposed under a GMR element 1206. The TMR element 1204 and the GMR element 1206 can have a common antiferromagnetic pinning layer labeled as a common AF layer. The magnetoresistance assembly 1200 can be the same as or similar to the magnetoresistance assembly 1100 of FIG. 11.

The TMR element 1204 can include an electrical contact 1208b, which may be a plated or conductively filled via, and which can be disposed under a bottom surface of the TMR element 1204 proximate to the substrate 1202. The electrical contact 1208b can be coupled to a portion 1216b of a first metal layer 1216 disposed over the substrate 1202, e.g., between the substrate 1202 and a bottom surface of TMR element 1204.

The GMR element 1206 can include first and second electrical contacts 1208c, 1208d, which may be plated or conductively filled vias, and which can be disposed over a top surface of the GMR element 1206 distal from the substrate 1202. The first and second electrical contacts 1208c, 1208d can be coupled to first and second portions 1222a, 1222b, respectively, of a second metal layer 1222 disposed over the substrate 1202, e.g., over the top surface of the GMR element 1206.

In some embodiments, the portion 1222a of the second metal layer 1222 can be coupled through a plated or conductively filled via 1208a another portion 1216a of the first metal layer 1216.

In some embodiments, the portion 1222b of the second metal layer 1222 can be coupled through a plated or conductively filled via 1208e to another portion 1216c of the first metal layer 1216.

A voltage generator 1210 or a current generator can generate a current 1210a coupled to the first portion 1216b of the first metal layer 1216.

It should be understood that the portions 1216a, 1216b, 1216c of the first metal layer 1216 can be electrically separate, such that the current 1210a can be received at the portion 1216b of the first metal layer 1216, a GMR output signal 1214 can be generated at the portion 1216c of the first metal layer 1216, and a TMR output signal 1212 can be generated at the portion 1216a of the first metal layer 1216. Other metal layers and other connection schemes are also possible.

To this end, a first portion of the current 1210a can travel across the GMR element 1206 to generate the GMR output signal 1214. A second current portion of the current 1210a can travel downward through the GMR element 1206 and downward through the TMR element 1204 to generate the TMR output signal 1212. The GMR element 1206 is not responsive, or is minimally responsive, to the second current portion passing downward through the GMR element 1206.

As described above, the GMR output signal 1214 and the TMR output signal 1212 can be generated at the same time. However, it is also possible to time multiplex the GMR output signal 1214 and the TMR output signal 1212, for example, by blocking currents of the GMR output signal 1214 or the TMR output signal 1216, one at a time. The blocking can be facilitated with electronic switches. It is also possible to generate only one of the GMR output signal 1214 or the TMR output signal 1212 by blocking current from the other one of the GMR output signal 1214 or the TMR output signal 1212.

All references cited herein are hereby incorporated herein by reference in their entirety.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

Elements of embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A magnetoresistance assembly, comprising:
   a substrate;
   a first GMR element disposed over the substrate, the first GMR element having a bottom surface and top surface; and
   a first TMR element disposed over the substrate, the first TMR element having a top surface and a bottom surface, wherein the first GMR element and the first TMR element share a common first pinning layer, wherein an infinite line perpendicular to and intersecting the top or bottom surface of the first TMR element intersects the top or bottom surface of the first GMR element such that the first GMR element is disposed over or under the first TMR element, and wherein the first GMR element and the first TMR element are in electrical communication.

2. The magnetoresistance assembly of claim 1, wherein the first GMR element has a first maximum response axis and the first TMR element has a second maximum response axis, wherein the first and second response axes are parallel to a major surface of the substrate.

3. The magnetoresistance assembly of claim 1, further comprising:
   first and second electrical contacts electrically coupled to the first GMR element; and
   an electrical contact electrically coupled to the first TMR element.

4. The magnetoresistance assembly of claim 3, wherein the first and second electrical contacts of the first GMR element comprise first and second conductive vias, respectively.

5. The magnetoresistance assembly of claim 4, wherein the electrical contact of the first TMR element comprises a conductive via.

6. The magnetoresistance assembly of claim 5, wherein the first and second electrical contacts of the first GMR element are electrically coupled to a first metal layer disposed over the substrate.

7. The magnetoresistance assembly of claim 6, wherein the electrical contact of the first TMR element is electrically coupled to a second metal layer disposed over the substrate, wherein the second metal layer is disposed over or under the first metal layer.

8. The magnetoresistance assembly of claim 7, further comprising a voltage source or a current source coupled to the first electrical contact of the first GMR element and operable to force a drive current into or out of the first electrical contact of the first GMR element.

9. The magnetoresistance assembly of claim 8, wherein a first GMR output signal is generated at the second electrical contact of the first GMR element and a TMR output signal is generated at the electrical contact of the first TMR element.

10. The magnetoresistance assembly of claim 6, further comprising a voltage source or a current source coupled to the first electrical contact of the first GMR element and operable to force a drive current into or out of the first electrical contact of the first GMR element.

11. The magnetoresistance assembly of claim 10, wherein a first GMR output signal is generated at the second electrical contact of the first GMR element and a TMR output signal is generated at the electrical contact of the first TMR element.

12. The magnetoresistance assembly of claim 4, further comprising a voltage source or a current source coupled to the first electrical contact of the first GMR element and operable to force a drive current into or out of the first electrical contact of the first GMR element.

13. The magnetoresistance assembly of claim 12, wherein a first GMR output signal is generated at the second electrical contact of the first GMR element and a TMR output signal is generated at the electrical contact of the first TMR element.

14. The magnetoresistance assembly of claim 13, wherein the first GMR element has a first sensitivity, wherein the second GMR element has a second sensitivity, wherein the first TMR element has a third sensitivity, and wherein the second TMR element has a fourth sensitivity, wherein the first and second sensitivities are different than the third and fourth sensitivities.

15. The magnetoresistance assembly of claim 3, further comprising a voltage source or a current source coupled to the first electrical contact of the first GMR element and operable to force a drive current into or out of the first electrical contact of the first GMR element.

16. The magnetoresistance assembly of claim 15, wherein a first GMR output signal is generated at the second electrical contact of the first GMR element and a TMR output signal is generated at the electrical contact of the first TMR element.

17. The magnetoresistance assembly of claim 1, wherein the first GMR element has a first sensitivity, and wherein the first TMR element has a second sensitivity different than the first sensitivity.

18. The magnetoresistance assembly of claim 1, further comprising:
   a second GMR element disposed over the substrate, the second GMR element having a top surface and a bottom surface; and
   a second TMR element disposed over the substrate, the second TMR element having a top surface and a bottom surface, wherein a second infinite line perpendicular to and intersecting the top or bottom surface of the second TMR element intersects the top or bottom surface of the second GMR element such that the second GMR element is disposed over or under the second TMR element, wherein the second GMR element and the second TMR element are in electrical communication.

19. The magnetoresistance assembly of claim 18, wherein the second GMR element and the second TMR element share a second common pinning layer.

20. The magnetoresistance assembly of claim 18, wherein the first GMR element has a first maximum response axis, the second GMR element has a second maximum response axis, the first TMR element has a third maximum response axis, and the second TMR element has a fourth maximum response axis, and wherein the first, second, third, and fourth maximum response axes are parallel to a major surface of the substrate.

21. The magnetoresistance assembly of claim 18, wherein the first GMR element comprises first and second electrical contacts, wherein the second GMR element comprises first and second electrical contacts, wherein the first TMR element comprises an electrical contact, and wherein the second TMR element comprises an electrical contact.

22. The magnetoresistance assembly of claim 21, wherein the first and second contacts of the first GMR element and the first and second contacts of the second GMR element comprise respective conductive vias.

23. The magnetoresistance assembly of claim 22, wherein the electrical contact of the first TMR element and the electrical contact of the second TMR element comprise respective conductive vias.

24. The magnetoresistance assembly of claim 21, wherein the first and second contacts of the first GMR element and the first and second contacts of the second GMR element are electrically coupled to a first metal layer disposed over the substrate.

25. The magnetoresistance assembly of claim 24, wherein the electrical contact of the first TMR element and the electrical contact of the second TMR element are electrically coupled to a second metal layer disposed over the substrate, wherein the second metal layers is disposed over or under the first metal layer.

26. The magnetoresistance assembly of claim 25, further comprising an electrical circuit coupled to the first electrical contact of the first GMR element or to the first electrical contact of the second GMR element, the electrical circuit operable to force a first drive current into or out of the first electrical contact of the first GMR element and operable to force a second drive current into or out of the first electrical contact of the second GMR element.

27. The magnetoresistance assembly of claim 26, wherein a first GMR output signal is generated at the second electrical contact of the first GMR element, a second GMR output signal is generated at the second electrical contact of the second GMR element, and a TMR output signal is generated at the second electrical contact of the second GMR element.

28. The magnetoresistance assembly of claim 21, further comprising an electrical circuit coupled to the first electrical contact of the first GMR element and to the first electrical contact of the second GMR element, the electrical circuit operable to force a first drive current into or out of the first electrical contact of the first GMR element and operable to force a second drive current into or out of the first electrical contact of the second GMR element.

29. The magnetoresistance assembly of claim 28, wherein a first GMR output signal is generated at the second electrical contact of the first GMR element, a second GMR output signal is generated at the second electrical contact of the second GMR element, and a TMR output signal is generated at the electrical contacts of the first and second TMR elements.

30. The magnetoresistance assembly of claim 1, wherein the first GMR element comprises a first GMR element free layer, and wherein the first TMR element comprises a first TMR element free layer different than the first GMR element free layer.

31. A method of forming a magnetoresistance assembly upon a substrate, comprising:
   forming a first GMR element disposed over the substrate, the first GMR element having a bottom surface and top surface; and
   forming a first TMR element disposed over the substrate, the first TMR element having a top surface and a bottom surface, wherein the first GMR element and the first TMR element share a common pinning layer, wherein an infinite line perpendicular to and intersecting the top or bottom surface of the first TMR element intersects the top or bottom surface of the first GMR element such that the first GMR element is disposed over or under the first TMR element, and wherein the first GMR element and the first TMR element are in electrical communication.

32. The method of claim 31, further comprising:
   forming first and second electrical contacts electrically coupled to the first GMR element; and
   forming an electrical contact electrically coupled to the first TMR element.

33. The method of claim 32, wherein the first and second electrical contacts of the first GMR element comprise first and second conductive vias, respectively.

34. The method of claim 33, wherein the electrical contact of the first TMR element comprises a conductive via.

35. A magnetoresistance assembly, comprising:
   a substrate;
   a GMR element disposed over the substrate, the GMR element having a bottom surface and top surface, the GMR element having a GMR element free layer; and
   a TMR element disposed over the substrate, the TMR element having a top surface and a bottom surface, the TMR element having a TMR element free layer different than the GMR element free layer, wherein an infinite line perpendicular to and intersecting the top or bottom surface of the TMR element intersects the top or bottom surface of the GMR element such that the GMR element is disposed over or under the TMR element, and wherein the GMR element and the TMR element are in electrical communication.

36. The magnetoresistance assembly of claim 35, further comprising:
   first and second GMR electrical contacts electrically coupled to the GMR element; and
   a TMR electrical contact electrically coupled to the TMR element.

37. The magnetoresistance assembly of claim 36, wherein the first and second GMR electrical contacts of the GMR element comprise first and second conductive vias, respectively.

38. The magnetoresistance assembly of claim 37, wherein the TMR electrical contact of the TMR element comprises a conductive via.

* * * * *

UNITED STATES PATENT AND TRADEMARK OFFICE
CERTIFICATE OF CORRECTION

PATENT NO. : 11,193,989 B2
APPLICATION NO. : 16/047342
DATED : December 7, 2021
INVENTOR(S) : Paolo Campiglio et al.

It is certified that error appears in the above-identified patent and that said Letters Patent is hereby corrected as shown below:

In the Specification

Column 1, Line 42 delete "another layer so-called" and replace with --another so-called--.

Column 1, Line 44 delete "magnetoresistances" and replace with --magnetoresistance--.

Column 2, Line 10 delete "and" and replace with --an--.

Column 3, Line 1 delete "side a" and replace with --a side--.

Column 5, Line 7 delete "element" and replace with --element 104.--.

Column 5, Line 11 delete "FIG. 3-6." and replace with --FIGS. 3-6.--.

Column 5, Line 24 delete "106." and replace with --206.--.

Column 5, Line 27 delete "in a currents" and replace with --in currents--.

Column 5, Line 28 delete "so-called in" and replace with --so-called--.

Column 5, Line 32 delete "so-called in" and replace with --so-called--.

Column 6, Line 46 delete "out to" and replace with --out of--.

Column 7, Line 27 delete "410 magnetically" and replace with --410 is magnetically--.

Column 8, Line 16 delete "conjuncitOno" and replace with --conjunction--.

Column 8, Line 31 delete "712*d*, 712*d*," and replace with --712*b*, 712*d*,--.

Signed and Sealed this
Tenth Day of January, 2023

Katherine Kelly Vidal
*Director of the United States Patent and Trademark Office*

CERTIFICATE OF CORRECTION (continued)
U.S. Pat. No. 11,193,989 B2

Column 10, Line 18 delete ", 914*b*." and replace with --, 914*b*,--.

Column 10, Line 27 delete "second" and replace with --first--.

Column 10, Line 32 delete "signals 928*b*." and replace with --signal 928*b*.--.

Column 10, Lines 54-55 delete "GMR element 1104." and replace with --TMR element 1104.--.

Column 11, Line 6 delete "out to" and replace with --out of--.

Column 11, Line 34 delete "TMR element 1108" and replace with --TMR element 1104--.

Column 12, Line 3 delete "1208*a* another" and replace with --1208*a* to another--.

Column 12, Line 34 delete "TMR output signal 1216," and replace with --TMR output signal 1212,--.

In the Claims

Column 14, Line 66 delete "layers" and replace with --layer--.